(12) United States Patent
Lee

(10) Patent No.: US 7,514,312 B2
(45) Date of Patent: Apr. 7, 2009

(54) METHOD OF MANUFACTURING SEMICONDUCTOR DEVICE

(75) Inventor: In No Lee, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 206 days.

(21) Appl. No.: 11/164,785

(22) Filed: Dec. 6, 2005

(65) Prior Publication Data

US 2007/0004167 A1  Jan. 4, 2007

(30) Foreign Application Priority Data

Jun. 30, 2005   (KR) .................. 10-2005-0057783

(51) Int. Cl.
*H01L 21/76* (2006.01)
(52) U.S. Cl. .................. 438/218; 438/424; 438/294; 257/E21.54; 257/E21.628; 257/E21.642
(58) Field of Classification Search ................ 438/218, 438/294, 400–454; 257/E21.54–57, E21.628, 257/E21.642
See application file for complete search history.

(56) References Cited

U.S. PATENT DOCUMENTS

| | | | | |
|---|---|---|---|---|
| 6,890,859 | B1 * | 5/2005 | Bamnolker et al. | 438/700 |
| 2001/0014512 | A1 * | 8/2001 | Lyons et al. | 438/424 |
| 2004/0092082 | A1 * | 5/2004 | Terahara et al. | 438/424 |
| 2004/0092115 | A1 * | 5/2004 | Hsieh et al. | 438/694 |
| 2005/0230780 | A1 * | 10/2005 | Ito et al. | 257/510 |
| 2006/0038219 | A1 * | 2/2006 | Wu et al. | 257/315 |

\* cited by examiner

*Primary Examiner*—W. David Coleman
*Assistant Examiner*—Sonya D McCall Shepard
(74) *Attorney, Agent, or Firm*—Marshall, Gerstein & Borun LLP

(57) ABSTRACT

Disclosed herein is a method of manufacturing semiconductor devices. After first isolation trenches are formed in a cell region, second isolation trenches are formed in a peripheral region by an etch process using a photoresist as a mask. As such, top corner portions of an active substrate of the peripheral region are rounded. It is thus possible to fundamentally prevent a hump phenomenon incurred by thinning of the gate oxide film.

14 Claims, 4 Drawing Sheets

METHOD OF MANUFACTURING SEMICONDUCTOR DEVICE

BACKGROUND OF THE DISCLOSURE

1. Field of the Disclosure

The present disclosure relates to a method of manufacturing semiconductor devices, and more specifically, to a method of manufacturing semiconductor devices in which a thinning phenomenon of a gate oxide film can be prevented.

2. Brief Description of Related Technology

FIGS. 1a to 1e are sectional views for explaining a method of manufacturing a semiconductor device in the related art.

Figure 1A:
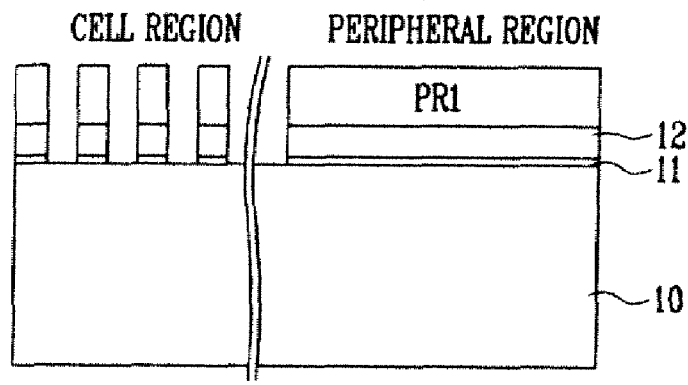

Referring to FIG. 1a, a pad oxide film 11 and a pad nitride film 12 are sequentially formed on a semiconductor substrate 10 in which a cell region and a peripheral region are divided and an active region and a field region are defined. A first photoresist PR1 is coated on the pad nitride film 12.

The first photoresist PR1 is patterned by means of an exposure and development process so that the field region in the cell region defined therein is opened. The pad nitride film 12 and the pad oxide film 11 are etched using the patterned first photoresist PR1 as a mask.

Figure 1B:
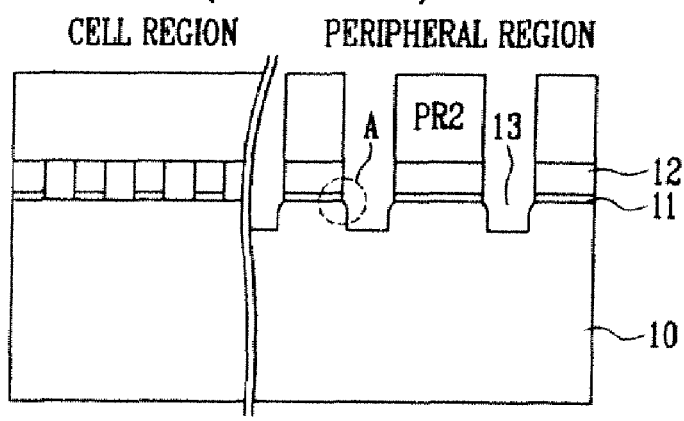

The first photoresist PR1 is removed. A second photoresist PR2 is coated on the entire surface, as shown in FIG. 1b.

Thereafter, the second photoresist PR2 is patterned by means of an exposure and development process so that the field region in the peripheral region is opened. The pad nitride film 12, the pad oxide film 11 and the semiconductor substrate 10 are etched using the patterned second photoresist PR2 as a mask, thus forming first trenches 13.

The depth of the first trenches 13 is set to a difference in a depth of an isolation film between the cell region and the peripheral region.

During the etch process of the first trenches 13, polymer is generated due to a carbon component of the second photoresist PR2. As the polymer component is deposited on the etched surface, top corner of the first trenches 13 are rounded, as indicated by a portion "A". That is, Top Corner Rounding (TCR) is formed in the first trench 13.

Figure 1C:
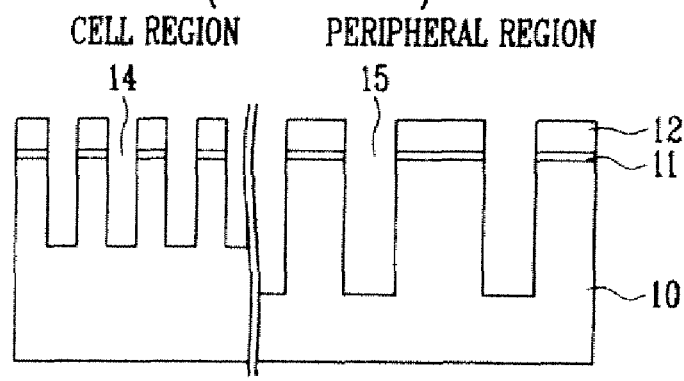

Referring next to FIG. 1c, the second photoresist PR2 is removed. The semiconductor substrate 10 of the cell region and the peripheral region is etched using the pad nitride film 12 as a mask, so that second trenches 14 are formed in the cell region and third trenches 15 having a depth deeper than that of the second trenches 14 are formed in the peripheral region. In this case, a difference in the depth between the third trench 15 and the second trench 14 corresponds to the depth of the first trenches 13.

The etch process of the second and third trenches 14 and 15 is performed by using the pad nitride film 12 not a photoresist as a mask. Accordingly, not only TCR is not formed, but also TCR already formed in the first trenches 13 is removed.

Figure 1D:
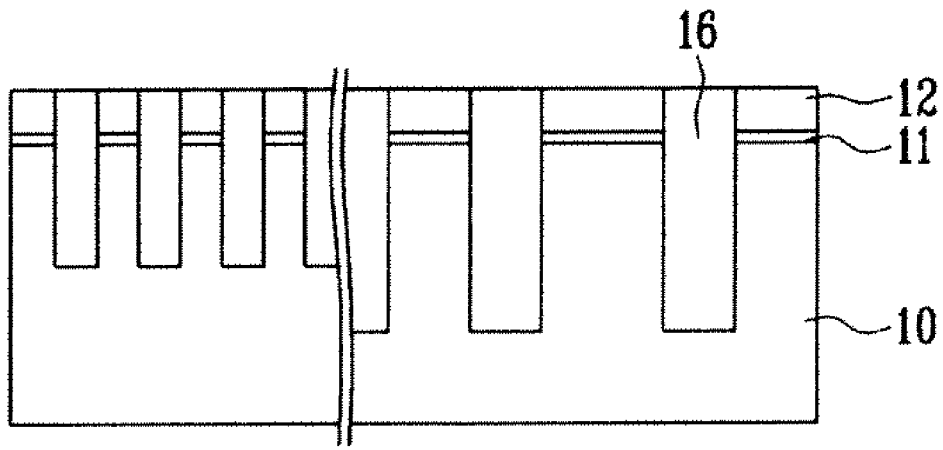
Figure 1E:
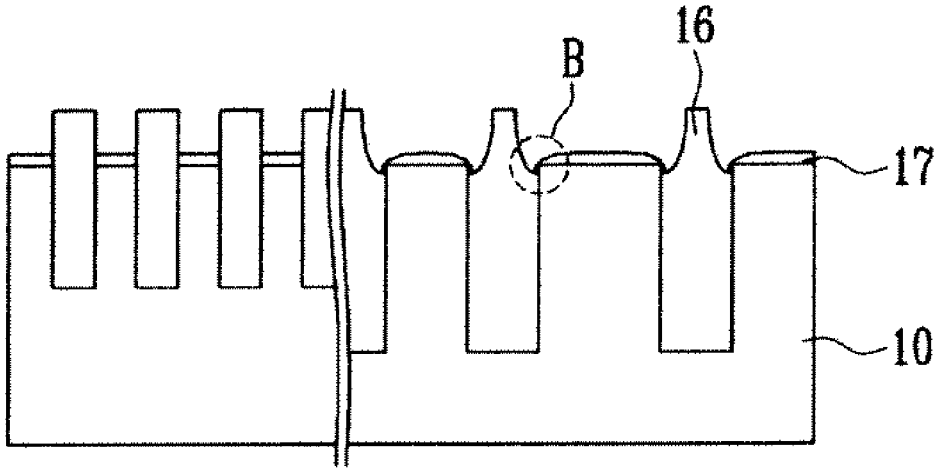

Referring next to FIG. 1d, an oxide film is deposited on the entire surface so that the second and third trenches 14 and 15 are fully buried. The oxide film undergoes Chemical Mechanical Polishing (CMP) so that the pad nitride film 12 is exposed, thus forming isolation films 16 within the second and third trenches 14 and 15.

The pad nitride film 12 and the pad oxide film 11 are removed to expose the semiconductor substrate 10 of the active region. Upon removal of the pad oxide film 11, in order to secure the space where the floating gate will be formed, the isolation film 16 projected higher than a surface of the semiconductor substrate 10 is also removed. The TCR portion of the active region, which has an angled shape, is exposed.

Gate oxide films 17 are then formed on the exposed semiconductor substrate 10.

The TCR portion of the semiconductor substrate 10 of the active region has an angled shape. Therefore, a thinning phenomenon in which a thickness of the gate oxide films 17 becomes thin at the edge portions of the active region is generated, as indicated by a portion "B".

As such, if the thinning phenomenon is generated in the gate oxide films 17, a hump phenomenon in which the current of over a predetermined value flows through a low-voltage device of a peripheral region is caused.

SUMMARY OF THE DISCLOSURE

Disclosed herein is a method of manufacturing semiconductor devices in which a thinning phenomenon of a gate oxide film formed in a peripheral region can be prevented.

The disclosed method can prevent a hump phenomenon.

The method includes the steps of providing a semiconductor substrate in which a cell region and a peripheral region are divided and an active region and a field region are defined, sequentially forming a pad oxide film and a pad nitride film on the semiconductor substrate, etching the pad nitride film, the pad oxide film of the field region in the cell region using a first photoresist pattern, forming first trenches in the field region of the cell region using a patterned pad nitride film as an etch mask, forming a second photoresist pattern through which the field region defined in the peripheral region is exposed, etching the pad nitride film, the pad oxide film and the semiconductor substrate using the second photoresist pattern as a mask, to form second trenches and to make rounded top corners of the semiconductor substrate in the peripheral region, removing the second photoresist pattern, forming isolation films within the first and second trenches, removing the pad nitride film and the pad oxide film to expose the semiconductor substrate of the active region, and forming a gate oxide film on the semiconductor substrate of the exposed active region.

Preferably, the second trenches can be formed using a plasma etch process.

Preferably, in the plasma etch process, one of Reactive Ion Etching (RIE), Magnetically Enhanced Reactive Ion Etching (MERIE), Inductively Coupled Plasma (ICP), Electron Cyclotron Resonance (ECR) and helicon equipment can be used as etch equipment.

Preferably, upon formation of the second trenches, one of $HBr$, $NF_3$, $Cl_2$, $BCL_3$, $C_2F_6$, $CHF_3$, $CF_4$, $C_4F_6$, $C_5F_6$ and $C_4F_8$ can be used as an etch gas.

Preferably, the second photoresist pattern is a KrF photoresist.

Preferably, the step of etching the pad nitride film includes the steps of providing a semiconductor substrate in which a cell region and a peripheral region are divided and an active region and a field region are defined, sequentially forming a pad oxide film and a pad nitride film on the semiconductor substrate, forming a hard mask film on the pad nitride film, forming the first photoresist pattern through which the field region defined in the cell region is opened on the hard mask film, patterning the hard mask film using the first photoresist pattern as a mask, removing the first photoresist pattern, etching the pad nitride film, the pad oxide film and the semiconductor substrate using the patterned hard mask film as a mask, thus forming the first trenches, forming a second photoresist pattern through which the field region defined in the peripheral region is exposed, etching the pad nitride film, the pad oxide film and the semiconductor substrate using the second photoresist patern as a mask, to form second trenches, and to make rounded top corners of the semiconductor substrate in the peripheral region, removing the second photoresist pattern, forming isolation films within the first and second trenches, removing the pad nitride film and the pad oxide film to expose the semiconductor substrate of the active regions, and forming a gate oxide film on the semiconductor substrate of the exposed active region.

Preferably, the hard mask film can be formed using one of an oxide film, an oxynitride film, a nitride film and a polysilicon film.

Preferably, the second photoresist pattern is an ArF photoresist.

Additional features of the disclosed method may become apparent to those skilled in the art from a review of the following detailed description, taken in conjunction with the drawing figures and the appended claims.

BRIEF DESCRIPTION OF THE DRAWING FIGURES

For a more complete understanding of the disclosed method, reference should be made to the following detailed description and accompanying drawing wherein:

FIGS. 1a to 1e are sectional views for explaining a method of manufacturing semiconductor devices in the related art; and FIGS. 2a to 2e are sectional views for explaining a method of manufacturing semiconductor devices according to an embodiment.

While the disclosed method is susceptible of embodiments in various forms, there are illustrated in the drawings (and will hereafter be described) specific embodiments of the disclosed method, with the understanding that the disclosure is intended to be illustrative, and is not intended to limit the claimed invention to the specific embodiments described and illustrated herein.

DETAILED DESCRIPTION OF THE PREFERRED EMBODIMENTS

Now, the preferred embodiments of the disclosed method will be described with reference to the accompanying drawings. Since preferred embodiments are provided for the purpose that the ordinary skilled in the art are able to understand the disclosed method, they may be modified in various manners and the scope of the claimed invention is not limited by the preferred embodiments described later.

FIGS. 2a to 2e are sectional views for explaining a method of manufacturing semiconductor devices according to one embodiment.

Figure 2A:
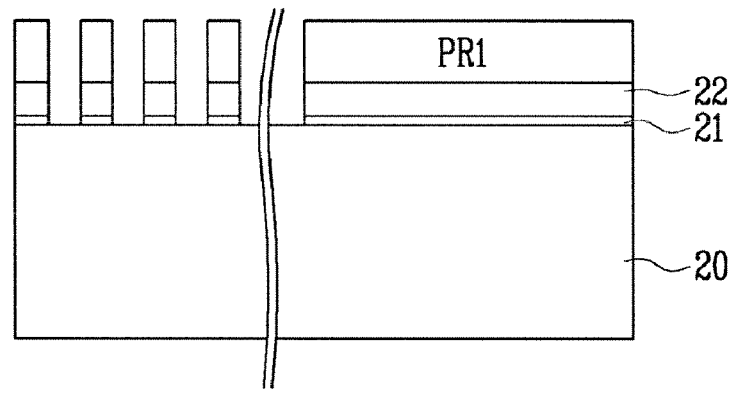

In order to manufacture the semiconductor device according to the disclosed method, a pad oxide film 21 and a pad nitride film 22 are sequentially formed on a semiconductor substrate 20 in which a cell region and a peripheral region are divided and an active region and a field region are defined, as shown in FIG. 2a. A first photoresist PR1 is coated on the pad nitride film 22.

The first photoresist PR1 is an ArF photoresist using an ArF light source as an exposure light source. It has a thin thickness and is weak in plasma, but is advantageous in fine patterning. Thus, in order to pattern a cell region having a small pattern size, the ArF photoresist has to be used.

The first photoresist PR1 is then patterned by means of an exposure and development process so that the field region in the cell region is opened.

Thereafter, the pad nitride film 22 and the pad oxide film 21 are etched using the patterned first photoresist PR1 as a mask, and the first photoresist PR1 is then removed.

As described above, the first photoresist PR1 is thin in thickness and is weak in plasma. Thus, upon etching of the pad nitride film 22 and the pad oxide film 21, the first photoresist PR1 can be deformed. Though not shown in the drawings, a hard mask process can be used, if needed, upon etching of the pad nitride film 22 and the pad oxide film 21.

That is, before the first photoresist PR1 is formed, a hard mask film is formed using one of an oxide film, an oxynitride film, a nitride film and a polysilicon film. The first photoresist PR1 is formed on the hard mask film. The first photoresist PR1 is then patterned by an exposure and development process so that the field region in the cell region is opened. The hard mask film is patterned by an etch process using the patterned first photoresist PR1 as a mask. After the first photoresist PR1 is removed, the pad nitride film 22 and the pad oxide film 21 are etched using the patterned hard mask film as a mask. The hard mask film is then removed.

Figure 2B:
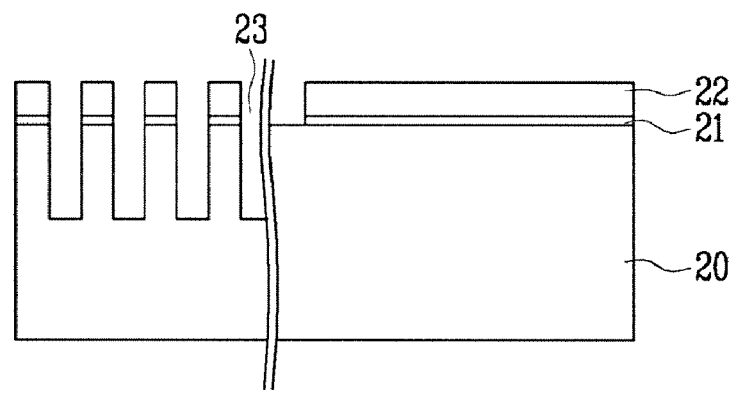

Referring next to FIG. 2b, the semiconductor substrate 20 of the cell region is etched using the pad nitride film 22 as a mask, thus forming first trenches 23.

At this time, the first trenches 23 are formed to a depth corresponding to a depth of an isolation film required in the cell region.

Figure 2C:
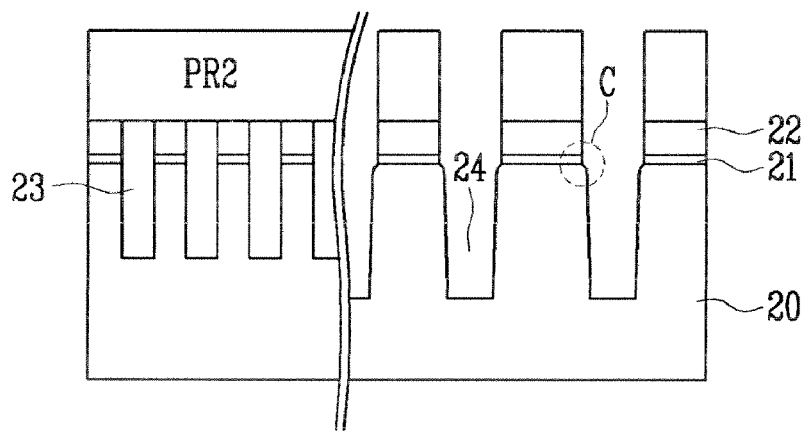

As shown in FIG. 2c, a second photoresist PR2 is coated on the entire surface. The second photoresist PR2 is patterned by an exposure and development process so that the field region in the peripheral region is opened.

The second photoresist PR2 formed in the peripheral region is a KrF photoresist using a KrF light source as an exposure light source. It is disadvantageous in fine patterning compared to the ArF photoresist, but can be formed thickly and has an insensitive characteristic to plasma. Accordingly, in a peripheral region having a large pattern size, the KrF photoresist is used.

The pad nitride film 22 and the pad oxide film 21 are etched using the patterned second photoresist PR2 as a mask. The semiconductor substrate 20 is etched to a depth of an isolation film required in the peripheral region using the plasma etch process, thus forming second trenches 24.

In this case, at the time of the plasma etch process, polymer is generated due to a carbon component of the second photoresist PR2. As the polymer component is deposited on the etched surface, the semiconductor substrate 20 at top corner portions of the second trenches 24 are rounded, as indicated by a portion "C". That is, TCRs are formed at the semiconductor substrate 20 of the peripheral region.

At the time of the plasma etch process, one of Reactive Ion Etching (RIE), Magnetically Enhanced Reactive Ion Etching (MERIE), Inductively Coupled Plasma (ICP), Electron Cyclotron Resonance (ECR) and helicon equipment can be used as etch equipment. One of HBr, $NF_3$, $Cl_2$, $BCL_3$, $C_2F_6$, $CHF_3$, $CF_4$, $C_4F_6$, $C_5F_6$ and $C_4F_8$ can be used as an etch gas.

Figure 2D:
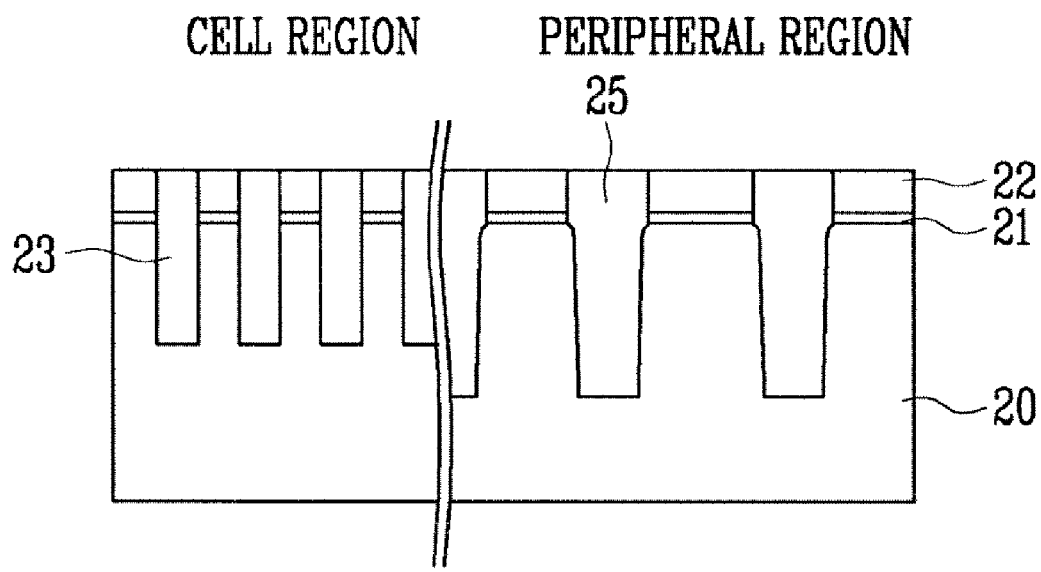

Referring next to FIG. 2d, an oxide film is deposited on the entire surface so that the first and second trenches 23 and 24 are fully buried. The oxide film undergoes CMP so that the pad nitride film 22 is exposed, thus forming isolation films 25 within the first and second trenches 23 and 24.

Figure 2E:
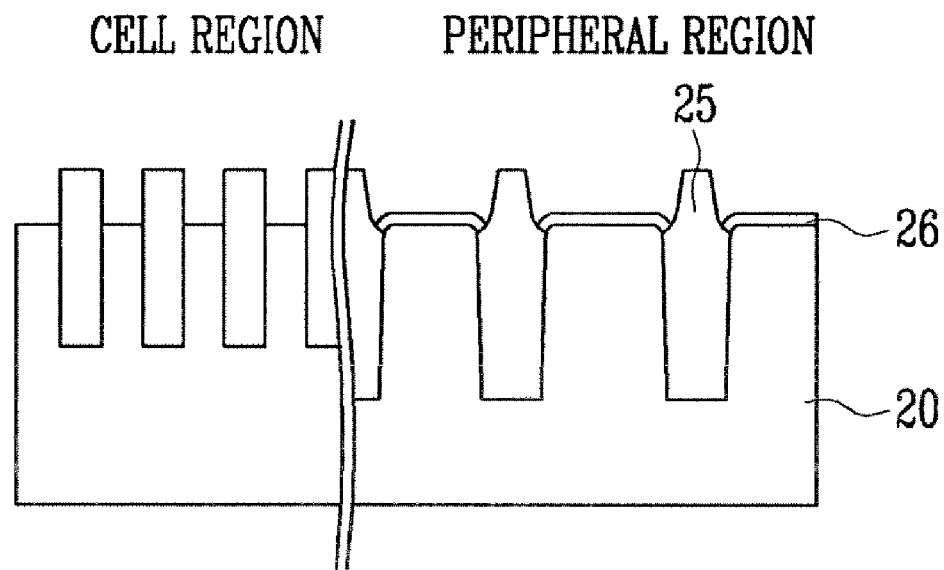

Referring next to FIG. 2e, the pad nitride film 22 and the pad oxide film 21 are sequentially removed to expose the semiconductor substrate 20 of the active region.

At this time, in order to secure the space where a floating gate will be formed, the isolation films 25 projected higher than the semiconductor substrate 20 is also removed simultaneously when the pad oxide film 21 is removed. Accordingly, the top corner portions of the active region, wherein the TCRs are formed are also exposed.

Thereafter, an oxide film is grown on the semiconductor substrate 20 of the exposed active region to form a gate oxide film 26. As the top corner portions of the active region have a round profile, the gate oxide film 26 having a uniform thickness is formed. That is, a thinning phenomenon is not generated in the gate oxide film 26.

Thereafter, though not shown in the drawings, a polysilicon film is deposited on the entire surface. The polysilicon film undergoes CMP so that the isolation films 25 are exposed, thus forming a gate. The semiconductor device is completed through a common device manufacturing process.

In the aforementioned embodiment, a dual trench structure in which the depth of the isolation trench of the cell region and the depth of the isolation trench of the peripheral region are different from each other has been described. It is, however, to be understood that the disclosed method can be applied to a single trench structure in which an isolation trench is formed in the cell region and the peripheral region to the same depth and a multi trench structure in which isolation trenches are formed to two or three kinds of depths.

Meanwhile, in the aforementioned embodiment, it has been described that the disclosed method is applied to a Self-Aligned Floating Gate (SFG) process. It is, however, to be noted that the disclosed method can be applied to all semiconductor device manufacturing processes in which isolation films of a Shallow Trench Isolation (STI) structure are formed, such as a conventional STI process of forming isolation films having the STI structure and then forming a gate electrode, and a STI process of forming a gate electrode and patterning the gate electrode upon formation of an isolation trench.

As described above, according to the present invention, after first isolation trenches are formed in a cell region, second isolation trenches are formed in a peripheral region by an etch process using a photoresist as a mask. Accordingly, top corner portions of an active substrate of the peripheral region can be made round.

As such, since a gate oxide film having a uniform thickness can be formed, a hump phenomenon incurred by thinning of the gate oxide film can be fundamentally prevented.

What is claimed as new and desired to be protected by Letters Patent of the United States is:

1. A method of manufacturing semiconductor devices, the method comprising:
    (a) providing a semiconductor substrate in which a cell region and a peripheral region are divided and an active region and a field region are defined;
    (b) sequentially forming a pad oxide film and a pad nitride film on the semiconductor substrate;
    (c) etching the pad nitride film and the pad oxide film of the field region in the cell region using a first photoresist pattern;
    (d) etching the semiconductor substrate in the field region of the cell region using a patterned pad nitride film as an etch mask to form first trenches in the semiconductor substrate;
    (e) forming a second photoresist pattern through which the field region defined in the peripheral region is exposed, wherein the second photoresist pattern covers over the first trenches;
    (f) etching the pad nitride film, the pad oxide film, and the semiconductor substrate using the second photoresist pattern as a mask, to form second trenches and to make rounded top corners of the semiconductor substrate in the peripheral region;
    (g) removing the second photoresist pattern;
    (h) forming isolation films within the first and second trenches;
    (i) removing the pad nitride film and the pad oxide film to expose the semiconductor substrate of the active region; and
    (j) forming a gate oxide film on the semiconductor substrate of the exposed active region.

2. The method of claim 1 wherein the etching of (f) comprises a plasma etch process.

3. The method of claim 2, comprising performing the plasma etch process with equipment selected from the group consisting of Reactive Ion Etching (RIE), Magnetically Enhanced Reactive Ion Etching (MERIE), Inductively Coupled Plasma (ICP), Electron Cyclotron Resonance (ECR), and helicon equipment.

4. The method of claim 1, comprising using, to form the second trenches, one of HBr, $NF_3$, $Cl_2$, $BCL_3$, $C_2F_6$, $CHF_3$, $CF_4$, $C_4F_6$, $C_5F_6$, and $C_4F_8$ as an etch gas.

5. The method of claim 1, wherein the second photoresist pattern is a KrF photoresist.

6. A method of manufacturing semiconductor devices, the method comprising:
    (a) providing a semiconductor substrate in which a cell region and a peripheral region are divided and an active region and a field region are defined;
    (b) sequentially forming a pad oxide film and a pad nitride film on the semiconductor substrate;
    (c) forming a hard mask film on the pad nitride film;
    (d) forming a first photoresist pattern through which the field region defined in the cell region is opened on the hard mask film;
    (e) patterning the hard mask film using the first photoresist pattern as a mask;
    (f) removing the first photoresist pattern;
    (g) etching the pad nitride film, the pad oxide film and the semiconductor substrate in the cell region using the patterned hard mask film as a mask to form first trenches;
    (h) forming a second photoresist pattern through which the field region defined in the peripheral region is exposed, wherein the second photoresist pattern covers over the first trenches;
    (i) etching the pad nitride film, the pad oxide film, and the semiconductor substrate in the peripheral region using the second photoresist pattern as a mask, to form second trenches, and to make rounded top corners of the semiconductor substrate in the peripheral region;
    (j) removing the second photoresist pattern;
    (k) forming isolation films within the first and second trenches;
    (l) removing the pad nitride film and the pad oxide film to expose the semiconductor substrate of the active region; and
    (m) forming a gate oxide film on the semiconductor substrate of the exposed active region.

7. The method of claim 6, comprising forming the hard mask film using one of an oxide film, an oxynitride film, a nitride film, and a polysilicon film.

8. The method of claim 6, wherein the second photoresist pattern is an ArF photoresist.

9. A method of manufacturing semiconductor device, comprising:
    (a) sequentially forming a gate oxide film and a pad nitride film on a semiconductor substrate having a cell region and a peripheral region;

(b) etching the semiconductor substrate in the cell region by a first process using the pad nitride film as a mask to form first trenches in the semiconductor substrate for an isolation film;
(c) forming a second photoresist pattern on the gate oxide film to cover the cell region and open field regions of the peripheral region, wherein the second photoresist pattern covers over the first trenches; and
(d) forming second trenches for an isolation film in the peripheral region by a second process using the second photoresist pattern as a mask.

10. The method of claim 9 wherein, the first process comprises:
    forming a first photoresist pattern on the gate oxide film to cover the peripheral region and open field regions of the cell region;
    performing a first etching process using the first photoresist pattern as a mask to etch to etch the gate oxide film and the pad nitride film; and
    performing a second etching process to etch the semiconductor substrate to form the first trenches.

11. The method of claim 9, wherein the second process comprising performing a third etching process to form the second trenches.

12. The method of claim 11, wherein the third etching process is a plasma etching process.

13. The method of claim 12, comprising performing the plasma etch process with equipment selected from the group consisting of Reactive Ion Etching (RIE), Magnetically Enhanced Reactive Ion Etching (MERIE), Inductively Coupled Plasma (ICP), Electron Cyclotron Resonance (ECR), and helicon equipment.

14. The method of claim 11, comprising performing the third etching process using one of HBr, $NF_3$, $Cl_2$, $BCL_3$, $C_2F_6$, $CHF_3$, $CF_4$, $C_4F_6$, $C_5F_6$ and $C_4F_8$ is used as an etch gas.

* * * * *